(12) United States Patent
Seita

(10) Patent No.: US 6,808,352 B2
(45) Date of Patent: Oct. 26, 2004

(54) METHOD FOR TRANSPORTING BOARDS, LOAD PORT APPARATUS, AND BOARD TRANSPORT SYSTEM

(75) Inventor: Hisaharu Seita, Kanagawa (JP)

(73) Assignee: Semiconductor Leading Edge Technolgies, Inc., Ibaraki (JP)

( * ) Notice: Subject to any disclaimer, the term of this patent is extended or adjusted under 35 U.S.C. 154(b) by 28 days.

(21) Appl. No.: 10/219,820

(22) Filed: Aug. 16, 2002

(65) Prior Publication Data

US 2003/0049101 A1 Mar. 13, 2003

(30) Foreign Application Priority Data

Aug. 20, 2001 (JP) ........................................ 2001-249521

(51) Int. Cl.[7] ............................................. B65G 1/133
(52) U.S. Cl. ..................... 414/217.1; 414/939; 414/940
(58) Field of Search .............................. 414/217, 217.1, 414/935, 940

(56) References Cited

U.S. PATENT DOCUMENTS 6,074,154 A  * 6/2000 Ueda et al. ................. 414/217
6,135,168 A  * 10/2000 Yang et al. ................... 141/98
6,158,946 A  * 12/2000 Miyashita .................... 414/411
6,186,723 B1 * 2/2001 Murata et al. .............. 414/217
6,302,927 B1 * 10/2001 Tanigawa ................... 29/25.01
6,430,802 B1 * 8/2002 Miyajima .................... 29/464
6,473,996 B1 * 11/2002 Tokunaga .................... 34/417
6,592,318 B2 * 7/2003 Aggarwal ................ 414/217.1
6,609,876 B2 * 8/2003 Mages et al. ............... 414/808
6,641,350 B2 * 11/2003 Nakashima et al. ......... 414/217

* cited by examiner

Primary Examiner—Joe Dillon, Jr.
(74) Attorney, Agent, or Firm—Foley & Lardner LLP

(57) ABSTRACT

A substrate container having substrates stored therein and sealed with a door is placed onto a load port apparatus provided on a substrate processing system, and a door of the load port apparatus is docked with the door of the substrate container. An inside of the substrate container is pressurized before opening of the door of the substrate container before the door of the substrate container is opened and the substrates stored in the substrate container is transported to the substrate processing system.

6 Claims, 10 Drawing Sheets

METHOD FOR TRANSPORTING BOARDS, LOAD PORT APPARATUS, AND BOARD TRANSPORT SYSTEM

BACKGROUND OF THE INVENTION

1. Field of the Invention

The invention relates to a method for transporting substrates, to a load port apparatus, and to a substrate transport system.

Specific applications of the invention relate to the use and structure of a substrate transport method and those of a substrate transport system, which transports substrates container to contain substrates.

2. Background Art

The invention relates to, as a typical example, an airtight substrate container for housing and transporting substrates at the time of manufacture of a semiconductor device or liquid-crystal display device, as well as to a load port apparatus for taking the substrates housed in the substrate container into a substrate processing system. The invention will be described hereinbelow by means of taking manufacture of a semiconductor device as an example.

FIG. 8 is a perspective view for describing a known side-door-integral-type substrate container to be used for manufacture of a semiconductor device.

This container is listed in, e.g., a catalogue of FLUOROWARE Co., Ltd. A substrate container of this type is called a FOUP according to the SEMI standards. Here, the word "FOUP" is an abbreviation of "front opening unified pod." Information about detailed dimensions of the FOUP is provided in e.g. E62, E1.9 and E47.1 of the SEMI standards.

Reference numeral 100 shown in FIG. 8 designates a wafer carrier serving as a substrate container. Here, the wafer carrier is described by reference to a FOUP standardized by the SEMI standards. As shown in FIG. 8, reference numeral 2 designates a carrier door whose surface is partially cut away.

Here, the wafer carrier 100 has a carrier shell 1 and the carrier door 2. Boards can be loaded or unloaded by way of the carrier door 2 into the wafer carrier 100.

In the wafer carrier 100, substrates are supported by wafer teeth 10 provided inside a carrier shell 1 and by retainers 11 provided on the carrier door 2.

In a state in which the carrier door 2 is closed, the inside of the wafer carrier 100 is a sealed space, and substrates are protected from extraneous matter in the atmosphere or chemical contamination.

Transporting substrates to a substrate processing system where the substrates are to be subjected to required processing requires a load port apparatus having a mechanism for unloading substrates stored in the wafer carrier 100 and taking the substrates into the substrate processing system. For instance, the FOUP corresponds to a load port apparatus having an FIMS surface standardized by the SEMI standards.

The word "FIMS" is an abbreviation of "front-opening interface mechanical standard."

FIG. 9 is a schematic cross-sectional view showing a load port apparatus 300 provided in the substrate processing system when the wafer carrier 100 is placed on the load port apparatus 300.

The load port apparatus 300 has kinematic pins 31A to be used for placing the wafer carrier 100 at a given position on a table section 30 of the load port apparatus; and a load port door (FIMS door) 32 which performs opening and closing actions upon docking with the carrier door 2.

In this system, after the wafer carrier 100 housing substrates 19 has been placed on the load port apparatus 300, the load port door (FIMS door) 32 docks with the carrier door 2 of the wafer carrier 100, thereby opening the carrier door 2. At this time, the load port door 32 and the carrier door 2 that have docked with each other are stored at a predetermined location within the substrate processing system.

In such a system, when the carrier door 2 is opened or closed, external air enters the wafer carrier 100. At this time, extraneous matter or the like also enters the wafer carrier 100 while being mixed with the external air and adheres to the substrates stored in the wafer carrier 100. Adhesion of such extraneous matter potentially induces pattern failures or the like, and hence countermeasures against the extraneous matter must be taken in some way.

To this end, the load port apparatus is dimensionally designed and centered such that compatibility regarding dimensional accuracy and clearance is maintained among all FOUPs without involvement of a problem. There is prevented occurrence of extraneous matter, which would otherwise be caused by longitudinal, horizontal, or vertical offsets of the wafer carrier.

Gentle opening and closing of a door is implemented by means of lowering opening and closing speeds of a door or changing the speed or acceleration of the door at the time of opening the door. Alternatively, gentle opening and closing of the door is embodied by use of cams or springs. These measures prevent flow, into the wafer carrier, of external air including extraneous matter, which would otherwise be caused by friction of a packing or door.

In one type of load port apparatus, a movable section is changed from an upper location to a lower location for preventing adhesion of extraneous matter to the substrates even when the extraneous matter has developed from a movable section for detecting presence/absence of substrates or measuring the heights of substrates, such as a mapper.

A certain substrate processing system is constructed such that the inside of the system is maintained at a pressure higher than the pressure of the outside air, whereby the load port apparatus can effect blowout incessantly. Even if slight influx has developed, influx of outside air into the wafer carrier is prevented.

A carrier door of the wafer carrier is opened or closed by means of pulling away or pressing. The opening and closing actions of the carrier door will now be described by reference to FIGS. 10A through 10D.

FIGS. 10A to 10D are views showing the opening or closing states of the wafer carrier door. FIGS. 10A and 10B are views showing a state in which the carrier door is closed. FIGS. 10C and 10D are views showing a state in which the carrier door is opened.

As shown in FIG. 10A, when the carrier door 2 is closed, the carrier door 2 is pushed in the direction of the arrow. A narrow clearance is usually present between the carrier door 2 and a portion 1A of the carrier shell 1 opposing the same. Hence, when the carrier door 2 has started closing, an internal atmosphere of the wafer carrier 100 encounters difficulty in escaping outside. Accordingly, the inside of the wafer carrier 100 is pressurized by means of only an amount corresponding to the volume of the thus-pushed carrier door 2.

As shown in FIG. 10B, measures for releasing an internal atmosphere of the wafer carrier 100 to the outside can be taken by means of arranging the carrier shell so that the portion 1A of the carrier shell 1 opposing the carrier door 2 can be opened outside when the carrier door 2 is pushed. By means of the measures, even when extraneous matter has developed at the time of closing of the carrier door, the extraneous matter is carried by the flow of the atmosphere escaping from the inside of the carrier to the outside, thus preventing entry of the extraneous matter into the wafer carrier.

As shown in FIG. 10C, when the carrier door 2 is opened, the carrier door 2 is pulled away in the direction of the arrow. Even in this case, the clearance between the portion 1A of the carrier shell 1 and the carrier door 2 is usually narrow. Hence, the inside of the wafer carrier 100 is depressurized by only an amount corresponding to the volume of a withdrawn carrier door 2.

In this case, since the outside air has a positive pressure as compared with the depressurized inside of the carrier, the outside air can flow into the wafer carrier 100, as indicated by the arrows shown in FIG. 10D. For example, as shown in FIG. 10D, if extraneous matter has developed as a result of slight offset of the carrier door 2, the extraneous matter flows into the wafer carrier 100 while being carried by the flow into the wafer carrier 100. If the extraneous matter that has entered the wafer carrier 100 adheres to the substrates 19, a problem of occurrence of pattern failures will arise. Therefore, countermeasures against the problem must be taken in some way.

As has been described, when the carrier door of the wafer carrier is opened, the inside of the wafer carrier is depressurized by only an amount corresponding to the volume of the door to be pulled away, whereupon the outside air flows into the wafer carrier. If extraneous matter has developed in a sealing portion or a door of the wafer carrier by means of friction, the extraneous matter will enter the wafer carrier while being carried by the flow of outside air into the wafer carrier and adhere to substrates.

SUMMARY OF THE INVENTION

The invention aims at preventing entry of extraneous matter into a wafer carrier and proposes substrate transport means which prevents occurrence of a phenomenon of outside air flowing into a wafer carrier. This means enables a reduction in faulty products, such as imperfect products, and achievement of high production yield.

According to one aspect of the present invention, in a method of transporting substrates, a substrate container having substrates stored therein and sealed with a door is placed on a load port apparatus provided on a substrate processing system. A door of the load port apparatus is docked with the door of the substrate container. After an inside of the substrate container is pressurized, the door of the substrate container is opened. The substrates stored in the substrate container is transported to the substrate processing system.

In another aspect of the present invention, a load port apparatus comprises a table section which is provided in a substrate processing system and on which is placed a substrate container, and a mechanism for opening a door of the substrate container and transporting substrates stored in the substrate container to an inside of the substrate processing system. The load port apparatus further comprises gas supply means for supplying pressurized gas into the substrate container by way of a gas flow channel provided in the substrate container.

In another aspect of the present invention, a substrate transport system comprises a gas flow channel, a substrate container having a reclosable door, and a load port apparatus. The load port apparatus includes gas supply means, the means being provided in a substrate processing system and supplying pressurized gas. When the substrate container is placed on the load port apparatus, when a door of the substrate container is caused to dock with a door of the load port, and when the door of the substrate container is opened, to thereby transport substrates stored in the substrate container to an inside of the substrate processing system, the gas supply means of the load port apparatus can supply pressurized gas to an inside of the substrate container by way of the gas flow channel of the substrate container.

Other and further objects, features and advantages of the invention will appear more fully from the following description.

DETAILED DESCRIPTION OF THE PREFERRED EMBODIMENTS

Figure 1:
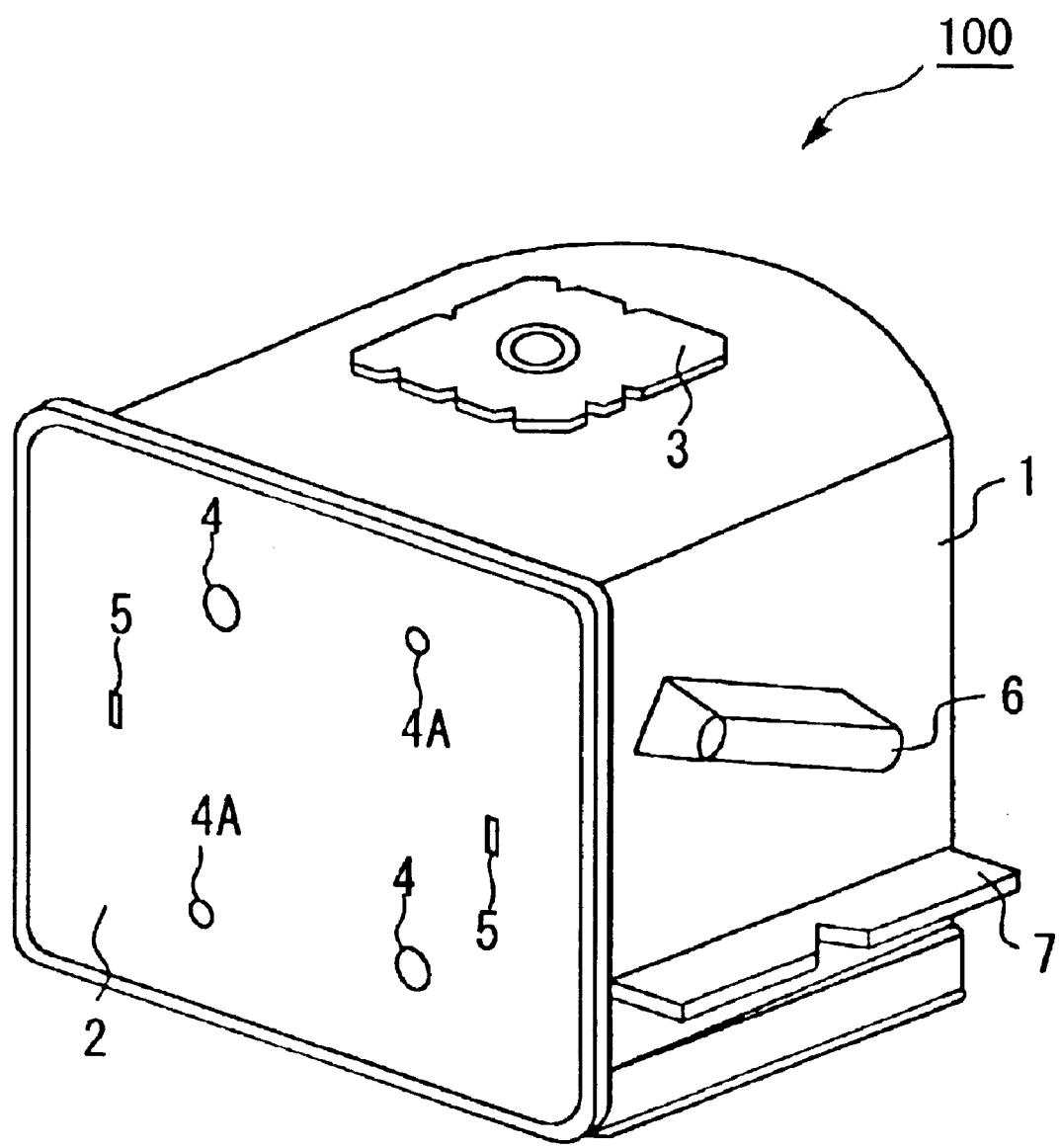
FIG. 1 is a view showing a substrate container to be used in the first embodiment of the present invention.

Embodiments of the invention will be described hereinbelow by reference to the drawings. Throughout the drawings, identical or corresponding elements are assigned the same reference numerals, and their repeated explanations are omitted or simplified.

First Embodiment

A first embodiment will be described briefly. In the first embodiment, the inside of a substrate container remains pressurized from the time the substrate container has been placed on a table section of a load port apparatus until a door of the substrate container is opened, and the door of the substrate container is opened in that state. As a result, when the door of the substrate container is opened, outside air can be prevented from entering the inside of the substrate container, thus inhibiting contamination.

FIG. 1 is a view showing a substrate container to be used in the first embodiment.

As shown in FIG. 1, reference numeral 100 designates a wafer carrier serving as a substrate container. In the first embodiment, a FOUP compliant with the SEMI standards is used as the wafer carrier.

Reference numeral 1 designates a carrier shell; and 2 designates a carrier door. Opening and closing of the carrier door 2 enables storage of substrates into the wafer carrier 100. Reference numeral 3 designates a robot flange; 6 designates a manual handle; and 7 designates a side rail, to be used for transporting the wafer carrier 100. These elements are provided on the exterior of the carrier shell 1.

In relation to the carrier door 2, reference numeral 4A designates purge ports having filters provided therein; 4 designates registration pin holes; and 5 designates latch key holes. The purge ports 4A are used for purging an internal atmosphere of the wafer carrier 100. The registration pinholes 4 are used for positioning the carrier door 2 and a load port door, which are to dock with each other, while registration pins 33A provided on a load port apparatus are fitted into the registration pin holes 4. The latch key holes 5 are used for opening and closing the carrier door 2 while latch keys 33 (mechanical opening/closing mechanisms) provided on the load port apparatus are inserted into the latch key holes.

Figure 2:
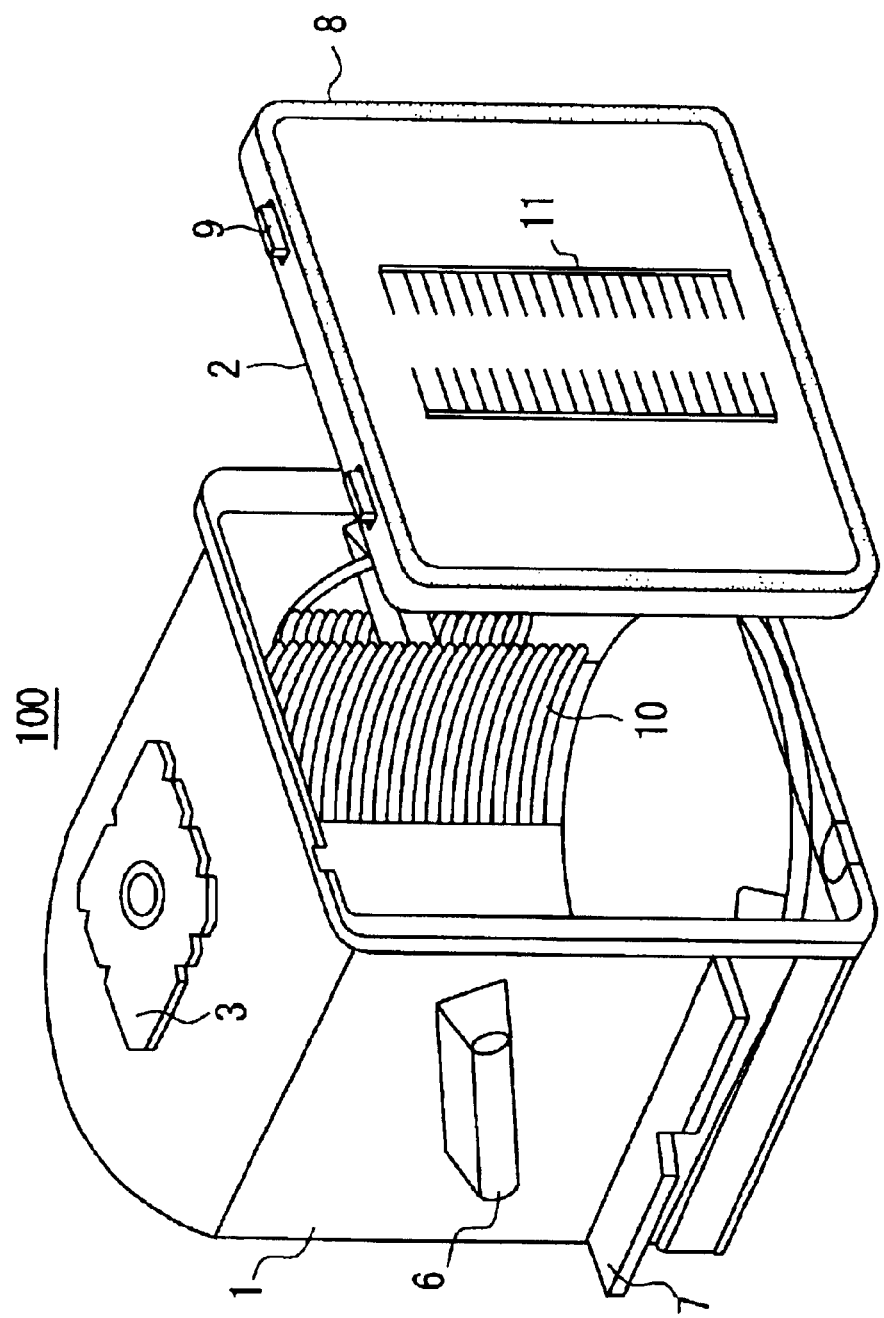
FIG. 2 is a perspective view showing the wafer carrier remaining opened.
Figure 3A:
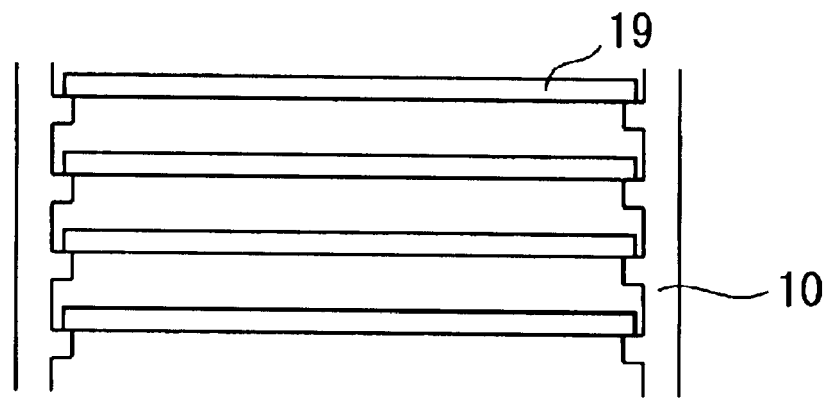
FIGS. 3A and 3B show substrates supported within the wafer carrier.
Figure 3B:
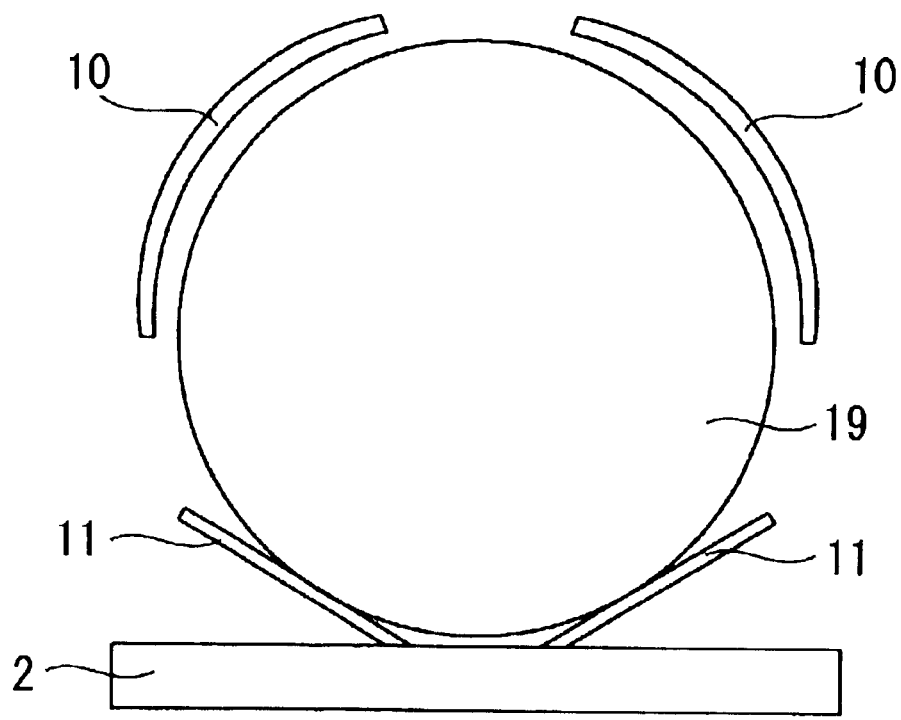

FIG. 2 is a perspective view showing the wafer carrier 100 remaining opened. Here, the carrier door 2 is separated from the carrier shell 1, to thereby disclose an interior side of the door. FIGS. 3A and 3B show substrates 19 supported within the wafer carrier 100, wherein FIG. 3A is a cross-sectional view, and FIG. 3B is a plan view of the wafer carrier.

As shown in FIG. 2, reference numeral 8 designates sealing material (packing); and 9 designate engagement pieces of a clamping mechanism. The sealing material 8 is provided on a surface of the carrier door 2 which comes into contact with the carrier shell 1, thereby maintaining a space enclosed by the carrier shell 1 and the carrier door 2 in a hermetic state. The engagement pieces 9 of the door clamping mechanism make the carrier door 2 fix to the carrier shell 1 in state of engaging with the engagement hole (not shown) provided on the carrier shell 1

Reference numeral 10 designates wafer teeth provided on an interior wall of the carrier shell 1; and 11 designates a retainer provided on an interior surface of the carrier door 2. A plurality of substrates 19 housed in the wafer carrier 100 are supported by the wafer teeth 10 and the retainer 11, which assume the shape of a shelf, in a state as shown in FIG. 3.

Figure 4A:
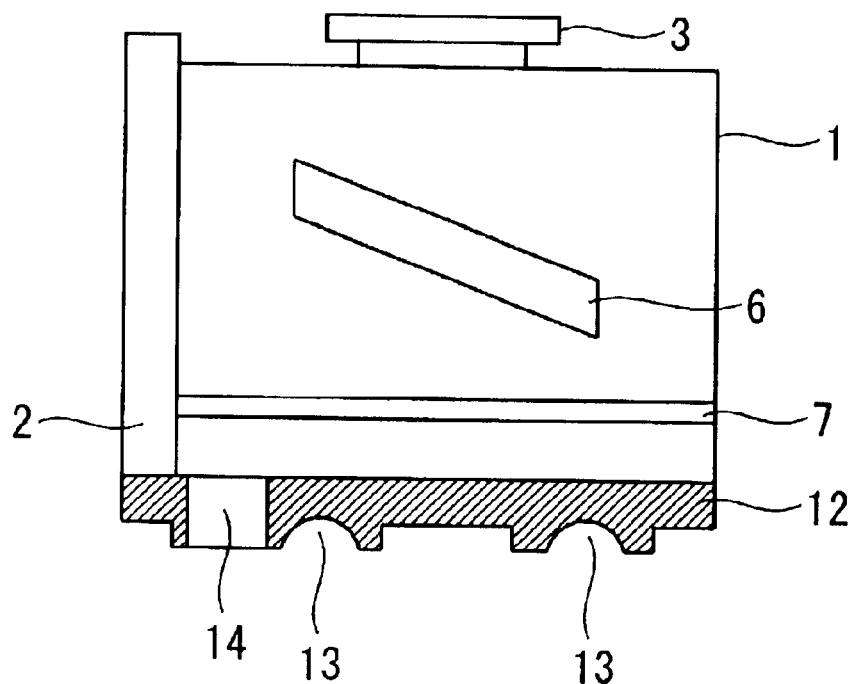
FIGS. 4A and 4B are conceptual drawings showing the wafer carrier.
Figure 4B:
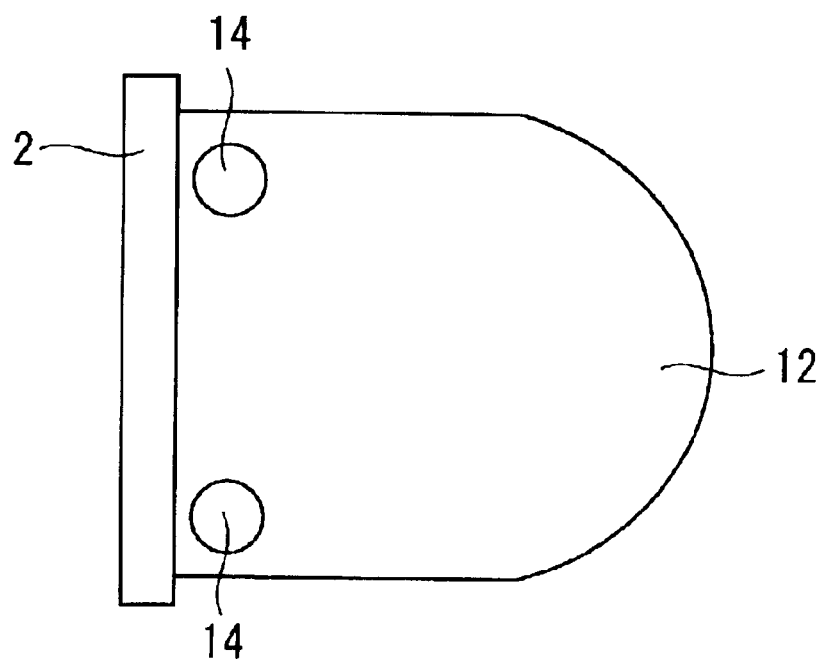

FIGS. 4A and 4B are conceptual drawings showing the wafer carrier 100. FIG. 4A is a side view including a fragmentary cross-sectional view of the wafer carrier 100, and FIG. 4B is a bottom view of the wafer carrier 100.

As shown in FIG. 4, reference numeral 12 designates a base plate serving as a bottom of the wafer carrier 100; and 13 designates V-shaped grooves formed in the base plate 12. In FIG. 4A, the base plate 12 is shown as a cross-sectional view.

Reference numeral 14 designates filters provided in the base plate 12. The filters 14 have hitherto been provided for preventing contamination of the inside of the wafer carrier. Here, the filters 14 also play a role of inlet ports or gas flow channels to be connected with means for introducing high-pressure gas into the wafer carrier 100.

Figure 5:
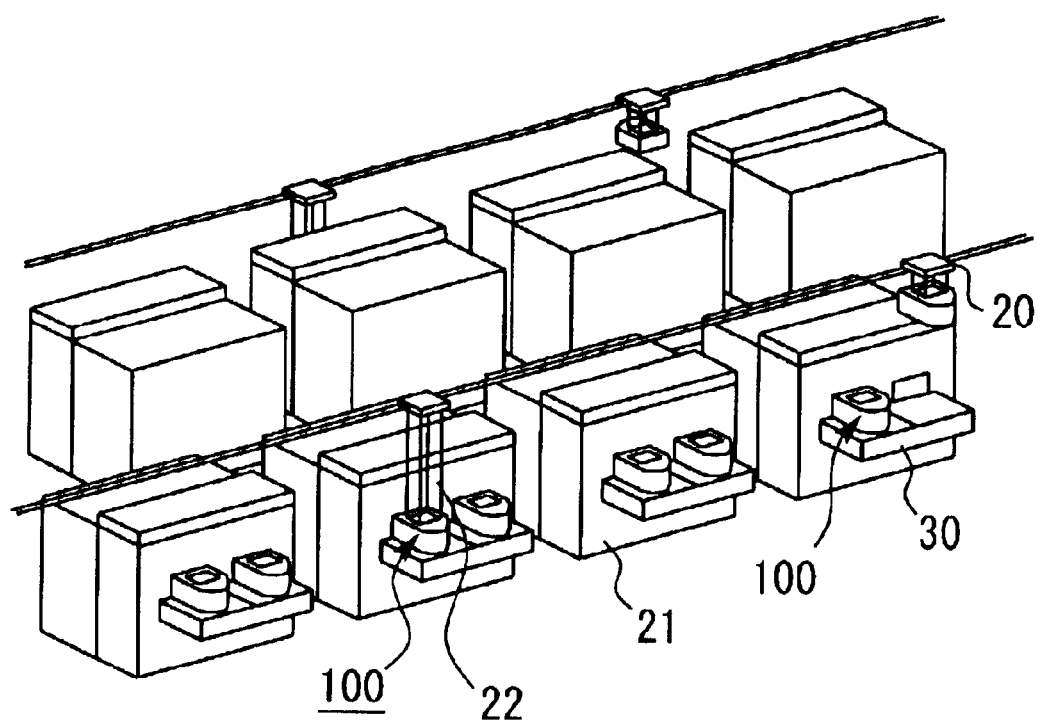
FIG. 5 is a schematic representation for describing a method of automatically transporting the wafer carrier at a production site where a plurality of substrate processing systems are provided.

FIG. 5 is a schematic representation for describing a method of automatically transporting the wafer carrier 100 at a production site where a plurality of substrate processing systems are provided.

As shown in FIG. 5, reference numeral 20 designates an OHT. Here, the word OHT is an abbreviation of "overhead hoist transport." The OHT automatically transports the wafer carrier 100 to each of the substrate processing systems.

Reference numeral 21 designates substrate processing systems; and 22 designates a hoisting mechanism. Reference numeral 30 designates a table section provided in the load port apparatus to be described later.

The OHT 20 is a typical automatic transport device of the wafer carrier 100 provided in a bay of a semiconductor factory. Each of the substrate processing systems 21 arranged in a line is equipped with a table section 30 of the corresponding load port apparatus. The wafer carrier 100 to be transported by use of the OHT 20 is placed on the table section 30.

Figure 6:
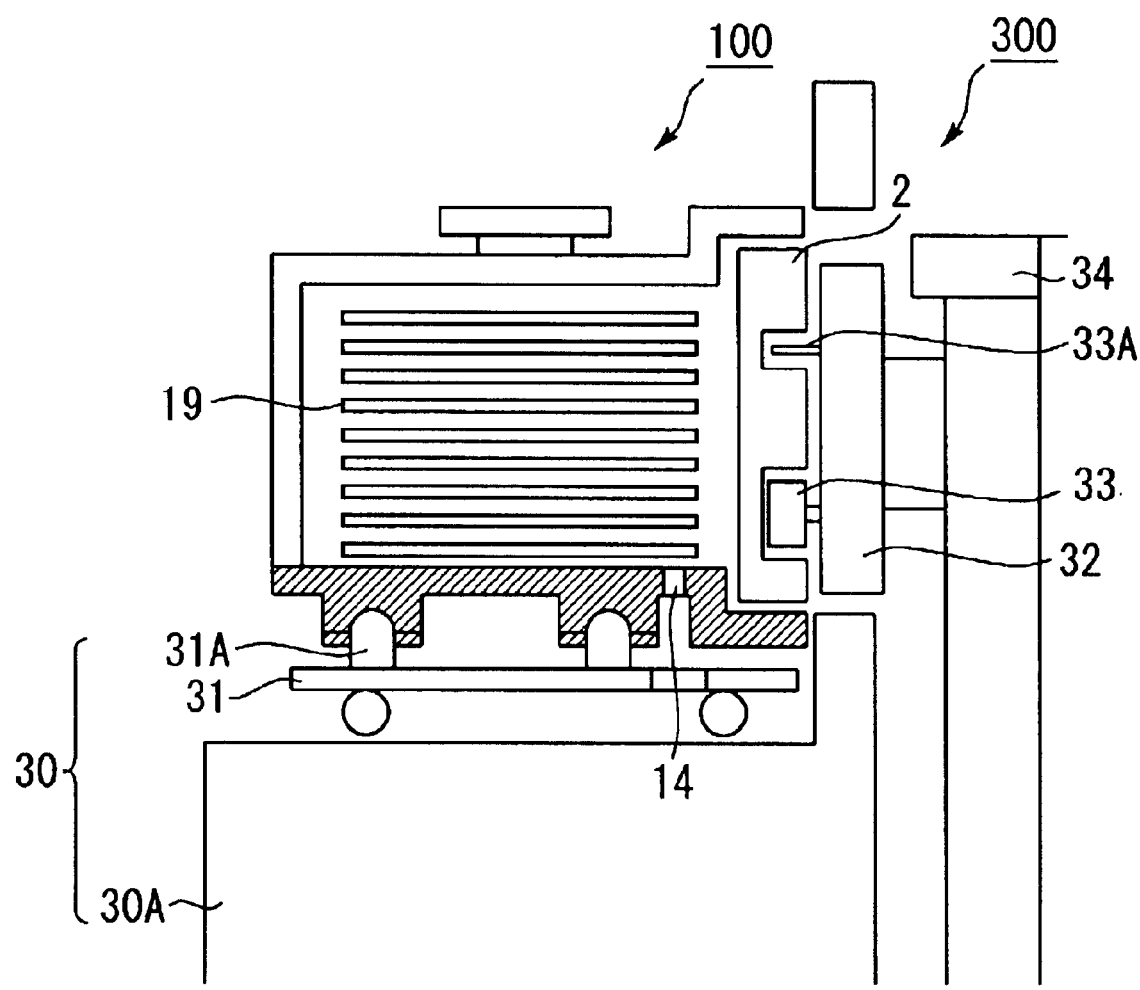
FIG. 6 is a schematic cross-sectional view showing the load port apparatus provided on the substrate processing system when the wafer carrier 100 is placed on the load port apparatus.

FIG. 6 is a schematic cross-sectional view showing the load port apparatus provided on the substrate processing system when the wafer carrier 100 is placed on the load port apparatus.

As shown in FIG. 6, reference numeral 300 designates a load port apparatus provided on the substrate processing system 21.

Reference numeral 30A designates the base of a load port. Reference numeral 31 designates a kinematic surface provided on the load port base 30A. Reference numeral 31A designates kinematic pins projecting from the kinematic surface 31. The kinematic pins 31A fit into the V-shaped grooves 13 formed in the wafer carrier 100, thereby determining a position on the load port apparatus 300 at which the wafer carrier 100 is to be placed.

The table section 30 of the load port apparatus 300 is constituted of the load port base 30A, the kinematic surface 31, and the kinematic pins 31A.

Reference numeral 32 designates a load port door. The load port door 32 constitutes a portion of a wall surface of the substrate processing system 21. In the embodiment, the wall surface of the substrate processing system 21 constitutes a part of the FIMS surface, which operates with a FOUP compliant with the SEMI standards.

Reference numeral 33 designates a latch key provided on the surface of the load port door 32. The latch key 33 is used for opening and closing the carrier door 2 while being inserted into the latch key hole 5 to be used for opening and closing the carrier door 2.

Reference numeral 34 designates a mapper to be used for detecting presence or absence of substrates in the wafer carrier or measuring the heights or positions of the substrates.

Figure 7A:
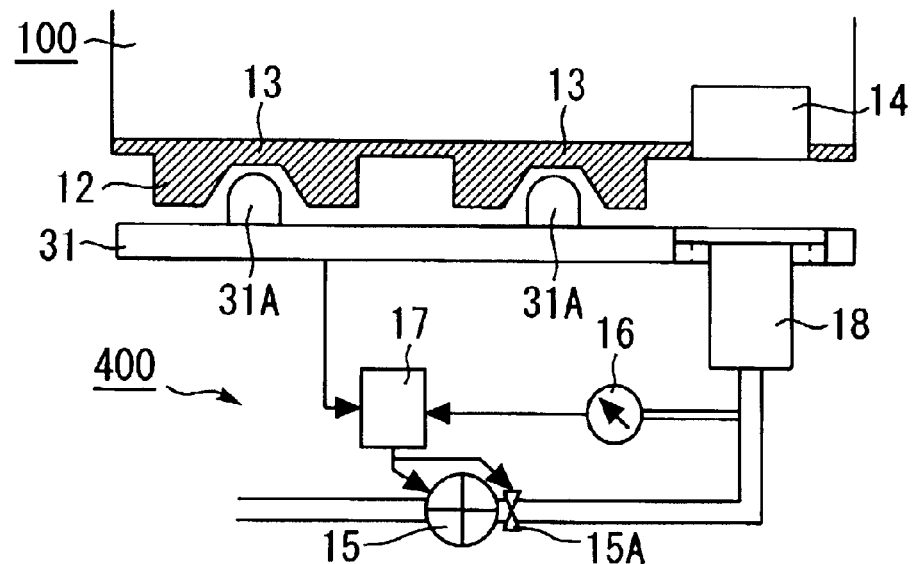
FIGS. 7A and B are views for showing the concept of gas supply means provided on the load port apparatus for pressurizing the inside of the wafer carrier.

FIG. 7 is a view for showing the concept of gas supply means provided on the load port apparatus 300 for pressurizing the inside of the wafer carrier 100.

Reference numeral 15 designates a valve; e.g., an electromagnetic valve, connected to a clean, dry, high-pressure gas supply source for pressurizing the inside of the wafer carrier 100. As a result of the valve 15 being opened, a dry, high-pressure gas is supplied to the inside of the wafer carrier 100. A depressurization valve 15A is provided in parallel with the valve 15, thereby enabling control of the volume of gas to be supplied.

Reference numeral 16 designates a pressure sensor for measuring the pressure of a gas to be introduced, and 17 designates control means for supplying, to the valve 15, a signal to be used for controlling the start/end of introduction of gas or the amount of gas to be introduced. The control means 17 senses that the wafer carrier 100 has docked with the kinematic surface 31 and receives a result of measurement performed by the pressure sensor. Thereupon, the control means 17 performs a control operation.

Reference numeral 18 designates a connection section to be connected to the inlet port 14 formed in the wafer carrier 100. When the wafer carrier 100 is placed on the kinematic surface 31, the connection section 18 is automatically connected to the inlet port 14 in association with the positioning action.

The gas supply means 400 is constituted of the valve 15, the pressure sensor 16, the control means 17, and the connection section 18 and the like.

The gas supply means 400 is provided on the load port apparatus 300 but is omitted from FIG. 6.

Next will be described a method of transporting substrates.

In the semiconductor factory, substrates to be subjected to various processing operations are transported among the substrate processing systems 21 while housed in the wafer carrier 100. When housing substrates having diameters of 300 mm diameter or more, the wafer carrier 100 has a weight of 8 kg or more. Therefore, manual transport of the wafer carrier 100 is hardly conceivable in terms of safety, and, for this reason an automatic transport device, such as the OHT section 20, is used.

By opening the carrier door 2 of the wafer carrier 100, substrates to be process are housed in the wafer carrier 100. The carrier door 2 of the wafer carrier 100 is then closed. As shown in FIG. 3, substrates are supported by the wafer teeth 10 and the retainer 11.

The OHT section 20 holds the robot flange 3 provided on the carrier shell 1, thereby hoisting the wafer carrier 100 having substrates stored therein. The thus-hoisted wafer carrier 100 is transported to the substrate processing system 21 in its present form by means of the OHT 20.

Next, the wafer carrier 100 is lowered on the kinematic surface 31 on the load port base 30A provided on the base processing system 21 and then set at a predetermined position by use of the hoisting mechanism 22. The kinematic pins 31A provided on the upper surface of the kinematic surface 31 fit into the V-shaped grooves 13 formed in the base plate surface 12, whereupon the wafer carrier 100 is placed at an appropriate position on the load port base 30A.

Figure 7B:
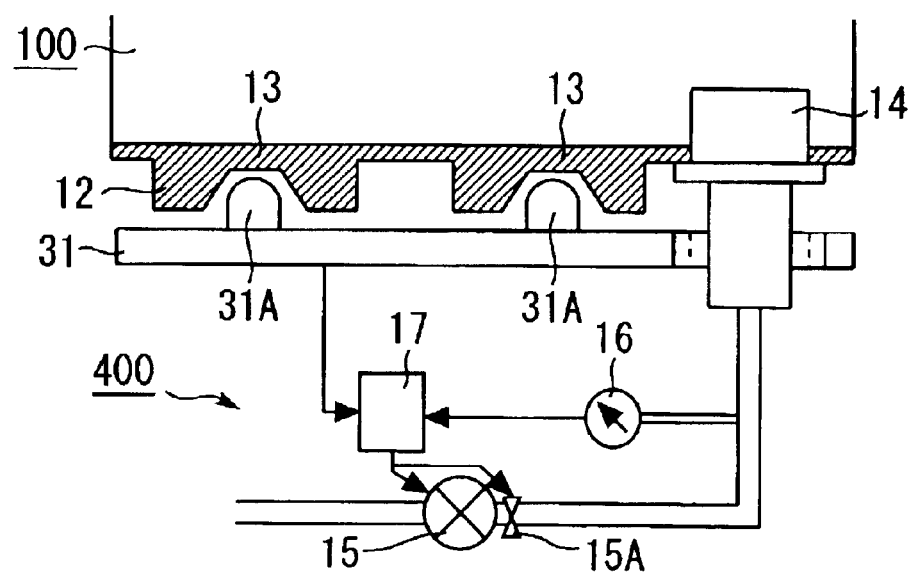
Figure 8:
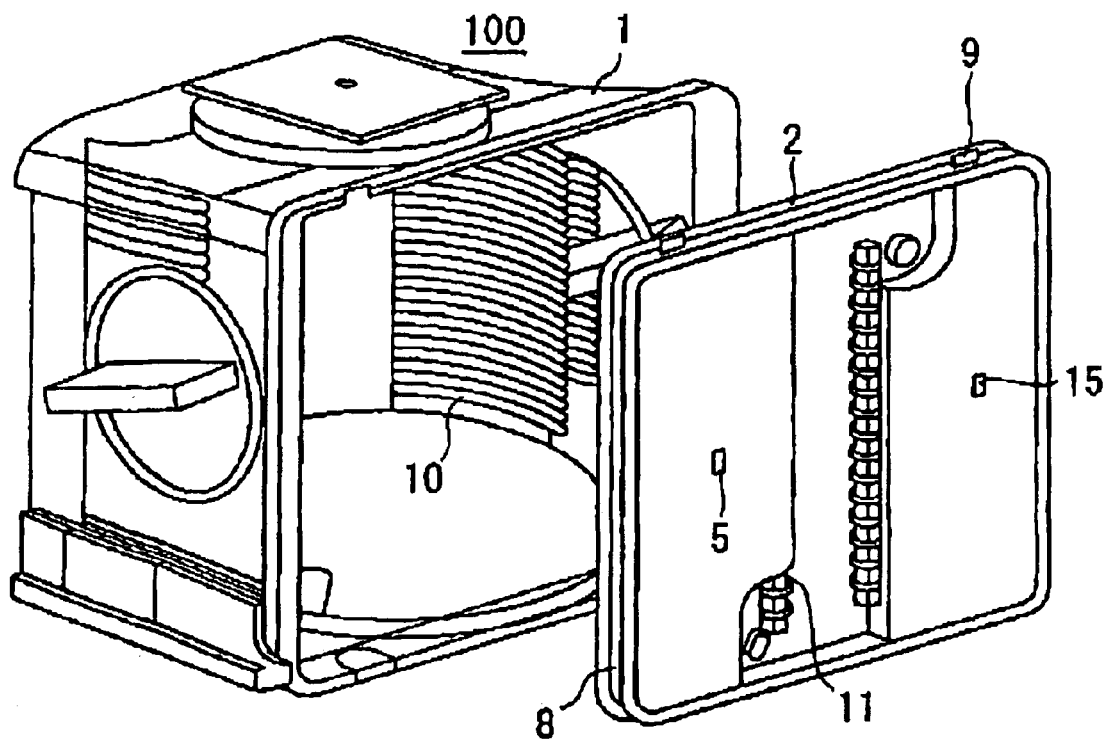
FIG. 8 is a perspective view for describing a known side-door-integral-type substrate container to be used for manufacture of a semiconductor device.
Figure 9:
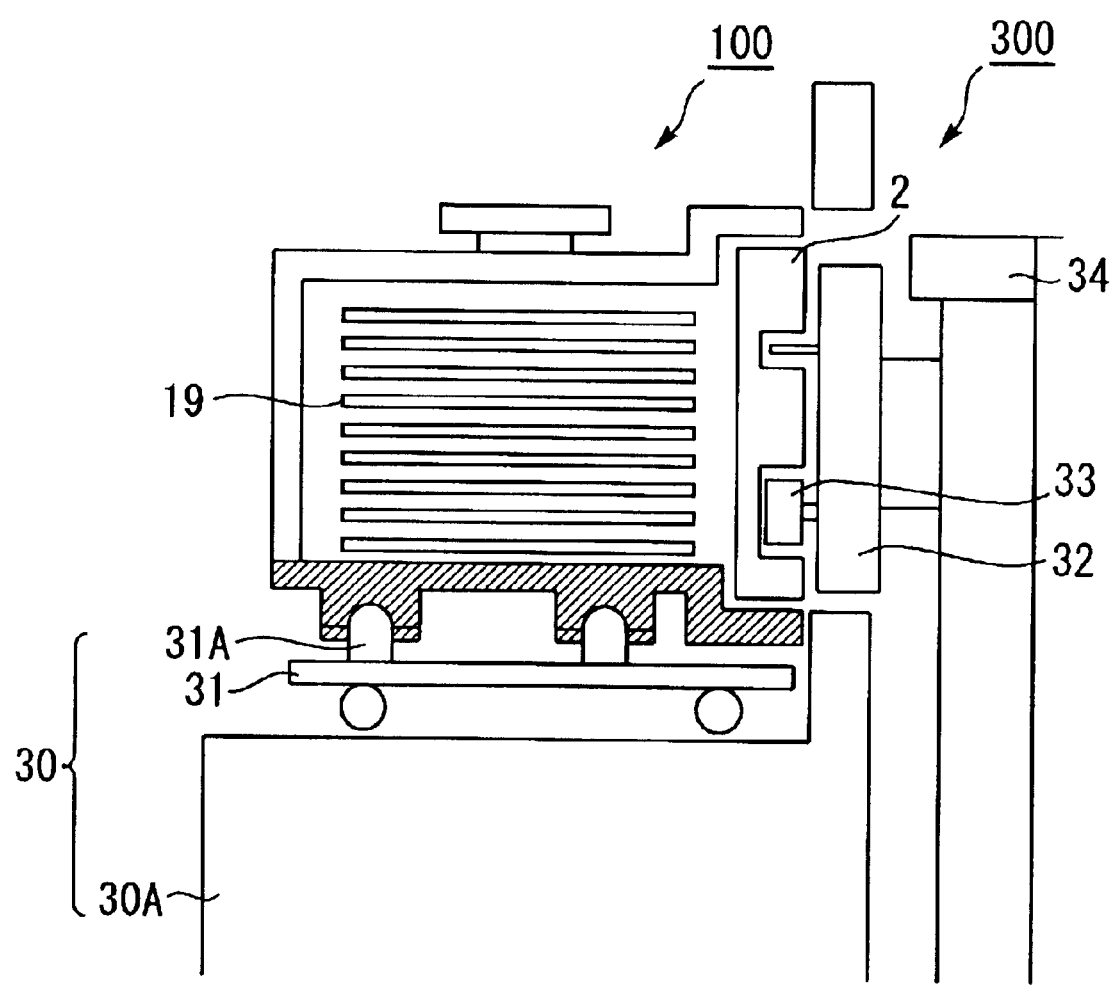
FIG. 9 is a schematic cross-sectional view showing a load port apparatus provided in the substrate processing system when the wafer carrier is placed on the load port apparatus.
Figure 10A:
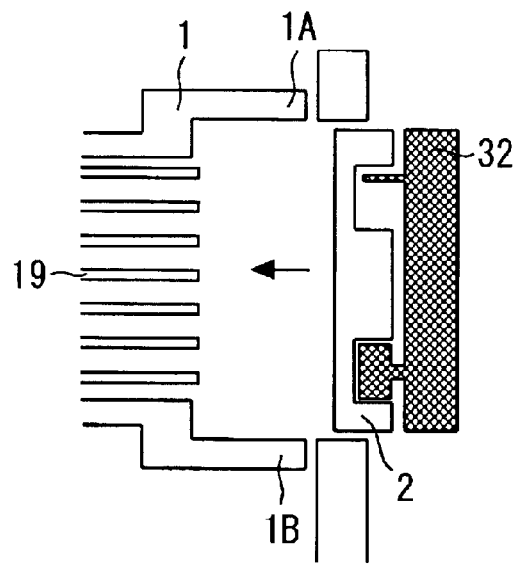
FIGS. 10A to 10D are views showing the opening or closing states of the wafer carrier door.
Figure 10B:
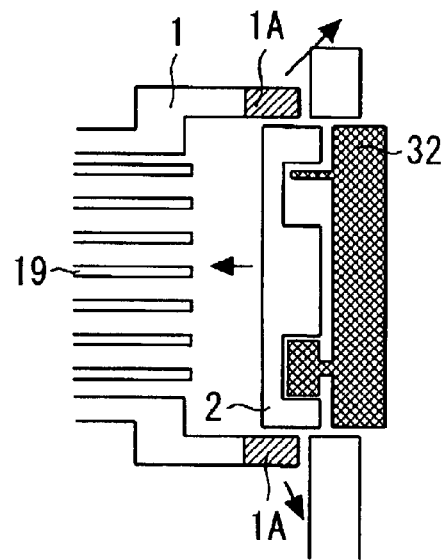
Figure 10C:
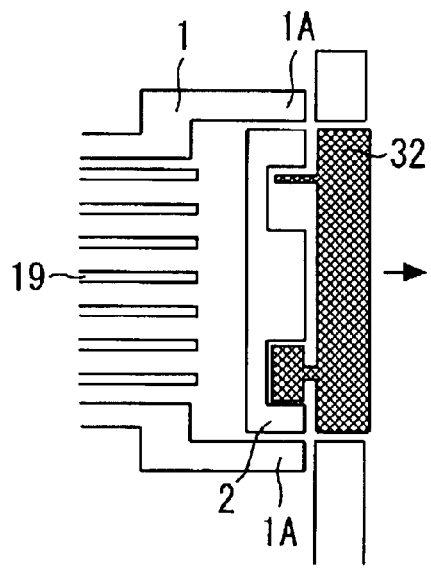
Figure 10D:
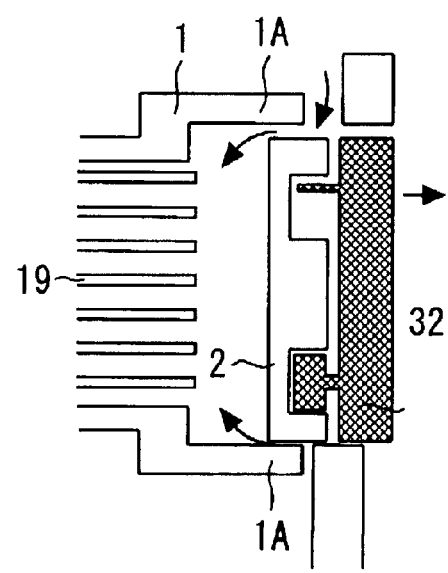

When the wafer carrier 100 is placed on the kinematic surface 31, in association with the placing action, the connection section 18 of the gas supply means 400 is connected to the inlet port 14 having a filter, as shown in FIG. 7B.

The control means 17 senses that the wafer carrier 100 has been placed, and the valve 15 is opened, to thereby start introduction of gas.

The hoisting mechanism 22 is removed from the wafer carrier 100, and the wafer carrier 100 is left on the load port base 30A. Subsequently, the wafer carrier 100 is advanced, to thereby cause the carrier door 2 to dock with the load port door 3. The wafer carrier 100 is advanced and brought into contact with the FIMS seal surface of the load port door 32.

Introduction of gas into the wafer carrier 100 is continued until the gas makes up for at least an amount corresponding to the volume of the carrier door 2 to be withdrawn.

At the time of introduction of gas, the pressure sensor 16 measures the pressure of pressurized gas. A result of measurement is conveyed to the control means 17. In accordance with the measurement result, the control means 17 controls the valve 15 and the depressurization valve 15A. The wafer carrier 100 is pressurized until the internal pressure of the wafer carrier 100 becomes positive with respect to the outside air. When a difference exists between the inside of an enclosure of the substrate processing system 21 and the outside of the enclosure, the inside pressure of the wafer carrier 100 is also increased so as to become positive with respect to the outside air by an amount corresponding to the difference, thereby increasing the inside pressure of the wafer carrier 100 to a positive pressure greater than or equal to than the internal pressure of the enclosure.

As mentioned above, the carrier door 1 is opened in the following manner while the internal pressure of the wafer carrier 100 is adjusted. First, the latch key 33 is rotated to disengage the engagement pieces 9 of the door clamping mechanism (not shown) of the carrier door 2 from the carrier shell 1 and to fasten the carrier door 2 to the load port door 32. Next, the carrier door 2 is removed fully from the carrier shell 1 and moved to a lower position within the substrate processing system 21.

At this time, the carrier door 2 is pulled out from the wafer carrier 100, whereby the wafer carrier 100 is depressurized by an amount corresponding to the volume of the carrier door 2. However, the inside of the wafer carrier 100 has been pressurized to a high pressure in advance by means of introducing dry high-pressure gas into the wafer carrier 100. The positive pressure inside the wafer carrier 100 prevents inflow of outside air into the wafer carrier 100. In this way, there can be prevented occurrence of entrainment, which would otherwise be caused when the pressure of the wafer carrier 100 becomes negative at the time of opening of the carrier door 2.

Even when the inside pressure of the enclosure is positive with respect to the outside air, the inside pressure of the wafer carrier 100 is also made positive by an amount corresponding to the pressure difference or more. Hence, inflow of outside air or inflow of gas from the inside of the enclosure can be prevented.

As has been described, in association with the wafer carrier 100 being placed on the table section 30 of the load port apparatus 300, the connection port 18 is connected to the filter 14. In association with the wafer carrier 100 being placed, the control means 17 opens the valve 15 and starts supplying gas. The control means 17 senses opening operation of the carrier door 2. In association with the opening operation, the inside of the wafer carrier 100 is pressurized until the carrier door 2 is opened.

In this way, the gas supply means 400 pressurizes the inside of the wafer carrier 100 in association with opening of the carrier door 2 by use of the control means 17, the valve 15, and the depressurization valve 15A.

The invention is not limited to a case where pressurizing operation can be performed in association with opening of the carrier door 2; the invention can be applied to any case, so long as the inside of the wafer carrier 100 can be pressurized before opening of the carrier door 2.

Since the inside of the wafer carrier 100 has already been pressurized at the time of opening of the door, supply of gas may be stopped. Alternatively, supply of gas may be continued even when the door is open. As a result, contamination of the inside of the wafer carrier 100 can be inhibited to a much greater extent.

As a method of introducing gas, there may be employed a method of continually introducing gas at a given rate. Alternatively, there may be employed a method of introducing gas while the volume of gas is changed in a pulsating manner. Moreover, there may be employed a method of increasing stepwise the amount of gas to be introduced.

Further, there may be employed a method of introducing gas while an increase in the volume of gas is changed gently; for example, a method of introducing gas according to an S-shaped waveform when a change in the volume of gas to be introduced is plotted in the form of a graph by means of taking the volume of gas to be introduced as the vertical axis and taking a time as the horizontal axis. As a result, the inside of the wafer carrier can be pressurized slowly, and there can be prevented occurrence of entrainment in the wafer carrier 100 and adhesion of extraneous matter, which would otherwise be caused by introducing gas.

In the embodiment, the filters 14 provided in the base plate 12 of the wafer carrier 100 have hitherto been used as gas inlet ports. However, the gas inlet ports are not limited to the filters; they may be embodied by any device specially provided for introducing gas. If two inlet ports are available, a difference may be set between the volumes of gas introduced by way of the two inlet ports. Alternatively, one of the two inlet ports may be closed such that gas is introduced by way of only the remaining inlet port.

In the embodiment, the gas supply means is constructed by means comprising the valve 15, the depressurization valve 15A, the pressure sensor 16, the control means 17, and the connection section 18. However, in the present invention, the gas supply means is not limited to such gas supply means and may be embodied as gas supply means not having a pressure sensor or as gas supply means not having the control valve 15A and the control means 17.

Second Embodiment

The wafer carrier 100, the OHT 20, and the load port apparatus 300 employed in a second embodiment of the invention are structurally identical with those shown in FIGS. 1 through 6.

Here, gas supply means 400 is provided at a position differing from that where the gas supply means 400 of the first embodiment is placed. In the first embodiment, the gas supply means 400 is provided on a table section 30 of the load port apparatus 300. In the present embodiment, the gas supply means 400 is provided on the load port door 32 of the load port apparatus 300.

In the first embodiment, the gas supply means 400 is connected to the filter 14 which is provided on the base plate 12 of the wafer carrier 100 and serves as an inlet port. In the second embodiment, the purge ports 4A are formed in the carrier door 2 of the wafer carrier 100. The purge ports 4A are to be used for purging gas from the inside of the wafer carrier 100 and are provided with filters.

In relation to the gas supply means 400, the connection section 18 is connected to the purge port 4A in association with the carrier door 2 docking with the load port door 32. The control means 17 opens the valve 15 and starts supplying gas in association with docking of the carrier door 2. Further, the control means 17 detects the opening operation of the carrier door 2 and pressurizes the inside of the wafer carrier 100 in association with the opening operation until the carrier door 2 is opened.

As mentioned above, the gas supply means 400 pressurizes the inside of the wafer carrier 100 in association with operations to be performed until the carrier door 2 is opened after having docked with the load port door 32, through use of the valve 15 and the control means 17.

The invention is not limited to a case where pressurizing operation can be performed in association with opening of the carrier door 2, but can be applied to any case, so long as the inside of the wafer carrier 100 can be pressurized before opening of the carrier door 2.

In the embodiment, the purge port provided in the wafer carrier is utilized as an inlet port. However, the invention is not limited to the case; there may also be provided an inlet port specifically designed for connection with the gas supply means. The inlet port may be provided with a filter.

In other respects, the second embodiment is identical with the first embodiment, and hence the remainder of its explanation is omitted.

In this way, the inside pressure of the wafer carrier 100 can be maintained positive, thereby preventing entrainment of outside air or internal gas of the enclosure, which would otherwise be caused at the time of opening of the door.

The features and the advantages of the present invention as described above may be summarized as follows.

According to one aspect of the present invention, pressure is continually applied to the inside of the base container before opening of the door of the base container or during the course of opening of the door until the inside pressure becomes positive with respect to the outside. Accordingly, there can be prevented entrainment of outside air into the base container, which would otherwise be caused at the time of opening of the door of the base container, thereby preventing adhesion of extraneous matter included in the outside air to substrates.

In another aspect, the invention can be implemented by means of adding only some type of gas supply means to a load port apparatus without making any improvements on a wafer carrier, an OHT, or the load port apparatus. The gas supply means requires only a pressure sensor, a valve, control means, and a connection port and does not need any special mechanism.

Therefore, low-cost, reliable manufacture of semiconductor devices can be implemented.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-249521, filed on Aug. 20, 2001 including specification, claims, drawings and summary, on which the Convention priority of the present application is based, are incorporated herein by reference in its entirety.

What is claimed is:

1. A method of transporting substrates comprising the steps of:

placing a substrate container having substrates stored therein and sealed with a door on a load port apparatus provided on a substrate processing system;

docking a door of the load port apparatus with the door of the substrate container;

pressurizing an inside of the substrate container so that the pressure inside the substrate container is higher than the internal pressure of an enclosure provided in the substrate processing system by a given level;

opening the door of the substrate container while the pressure inside the substrate container is such that inflow of outside air or gas from the enclosure is prevented; and transporting the substrates stored in the substrate container to the substrate processing system.

2. The method of transporting substrates according to claim 1, wherein pressurized gas is introduced from the outside of the substrate container by way of a gas flow channel which is provided in the substrate container and has a filter in the step of pressurizing.

3. The method of transporting substrates according to claim 2, wherein the pressurized gas is introduced while the volume of pressurized gas to be introduced is changed gently.

4. The method of transporting substrates according to claim 1, wherein pressurization is effected in association with opening of the door of the substrate container.

5. The method of transporting substrates according to claim 1, wherein pressurization is effected immediately after the load port door and the door of the substrate container have docked with each other until the door of the substrate container finishes opening.

6. The method of transporting substrates according to claim 1, wherein pressurization is effected immediately after the substrate container has been placed on a table section of the load port until the door of the substrate container finishes opening.

* * * * *

UNITED STATES PATENT AND TRADEMARK OFFICE
CERTIFICATE OF CORRECTION

PATENT NO. : 6,808,352 B2
DATED : October 26, 2004
INVENTOR(S) : Hisaharu Seita

It is certified that error appears in the above-identified patent and that said Letters Patent is hereby corrected as shown below:

<u>Title page,</u>
Item [73], Assignee, should read:
--     (73)     Assignee:     Semiconductor Leading Edge Technologies, Inc., Ibaraki (JP) --

Signed and Sealed this

First Day of February, 2005

JON W. DUDAS
*Director of the United States Patent and Trademark Office*